United States Patent
Ishida et al.

(10) Patent No.: US 7,902,053 B2
(45) Date of Patent: Mar. 8, 2011

(54) METHOD OF PROCESSING SEMICONDUCTOR WAFER

(75) Inventors: Hiroyasu Ishida, Gunma (JP); Yasuyuki Sayama, Ota (JP)

(73) Assignees: Sanyo Electric Co., Ltd, Osaka (JP); Sanyo Semiconductor Co., Ltd, Gunma (JP)

( * ) Notice: Subject to any disclaimer, the term of this patent is extended or adjusted under 35 U.S.C. 154(b) by 0 days.

(21) Appl. No.: 12/199,547

(22) Filed: Aug. 27, 2008

(65) Prior Publication Data
US 2009/0075461 A1  Mar. 19, 2009

(30) Foreign Application Priority Data

Sep. 13, 2007  (JP) ................................. 2007-238290

(51) Int. Cl.
*H01L 21/20* (2006.01)
(52) U.S. Cl. ... 438/494; 438/498; 438/504; 257/E21.092
(58) Field of Classification Search ............... 438/494, 438/498, 504; 257/E21.092
See application file for complete search history.

(56) References Cited

U.S. PATENT DOCUMENTS

| 5,177,028 A | * | 1/1993 | Manning ........................ 438/289 |
| 2005/0006699 A1 | * | 1/2005 | Sato et al. ..................... 257/327 |
| 2005/0048701 A1 | | 3/2005 | Minato et al. |
| 2009/0085149 A1 | | 4/2009 | Ishida et al. |

FOREIGN PATENT DOCUMENTS

WO  WO-02/067333  8/2002

OTHER PUBLICATIONS

Ishida, H. et al., U.S. Office Action mailed Oct. 22, 2009, directed to U.S. Appl. No. 12/236,348; 9 pages.
Ishida, H. et al., U.S. Office Action mailed on Apr. 15, 2010, directed to related U.S. Appl. No. 12/236,348; 11 pages.

* cited by examiner

*Primary Examiner* — Mary Wilczewski
*Assistant Examiner* — Toniae M Thomas
(74) *Attorney, Agent, or Firm* — Morrison & Foerster LLP

(57) ABSTRACT

Formation and etching of an n type epitaxial layer and formation and etching of a p type epitaxial layer are alternately performed on the semiconductor substrate for at least three times to form all semiconductor layers, of the epitaxial layers. Thereby, impurity concentration profiles of the semiconductor layers can be uniform, and pn junctions can be formed vertically to a wafer surface. Furthermore, the semiconductor layers can each be formed with a narrow width, so that impurity concentrations thereof are increased. With this configuration, high breakdown voltage and low resistance can be achieved.

5 Claims, 7 Drawing Sheets

Prior Art

Prior Art

METHOD OF PROCESSING SEMICONDUCTOR WAFER

This application claims priority from Japanese Patent Application Number JP 2007-238290 filed on Sep. 13, 2007, the content of which is incorporated herein by reference in its entirety.

BACKGROUND OF THE INVENTION

1. Field of the Invention

The present invention relates to a method for processing a semiconductor wafer. In particular, the present invention relates to shortening a process of processing a semiconductor wafer achieving high breakdown voltage and low on-resistance and to a method for processing a semiconductor wafer with improved characteristics.

2. Description of the Related Art

As a silicon semiconductor wafer achieving high breakdown voltage and low on-resistance, known is a wafer structure in which pillar-like p type semiconductor regions and n type semiconductor regions are provided so as to form multiple pn junctions vertical to a wafer surface. This technology is described for instance in International Patent Publication No. WO02/067333, Pamphlet.

In this structure, when impurity concentrations and widths of the p type semiconductor regions and n type semiconductor regions are selected to be desired values, high breakdown voltage can be achieved in the pn junctions under application of reverse voltage. In the following, the description will be given by referring to such a structure as a super junction structure.

By referring to FIGS. 7A, 7B, and 8A to 8C, examples of a method for processing a semiconductor wafer with a super junction structure will be described.

As shown in FIG. 7A, an n+ type semiconductor substrate 11 is prepared, and an n type semiconductor layer (epitaxial layer) 12' with a thickness of approximately 6 μm, for example, is stacked on a surface of the substrate 11. Subsequently, a mask with openings at predetermined intervals is disposed on the layer 12'. Then, ions of a p type impurity are implanted into the openings to form p type semiconductor regions 13'.

After that, the step of stacking then type semiconductor layers 12' (epitaxial growth) and the step of implanting ions of the p type impurity are repeated, for example, for seven times, to form a multi-layered epitaxial layer with a desired thickness (for example, approximately 42 μm). Finally, the ions of the p type impurity are diffused; thereby a wafer 20 with a super junction structure 20 in which pillar-like n type semiconductor regions 12 and p type semiconductor regions 13 are alternately arranged is formed (FIG. 7B).

The following method is also known.

As shown in FIGS. 8A to 8C, an n type semiconductor layer (epitaxial layer) 22 with a desired thickness is stacked on an n+ type semiconductor substrate 21, for example, and multiple trenches 23 are then formed, so that pillar-like n type semiconductor layers remain (FIG. 8A). Thereafter, ions of a p type impurity are implanted obliquely into portions of the n type semiconductor layers 22, the portions exposed on the side walls of the trenches 23, to form pillar-like p type semiconductor regions 24 (FIG. 8B). Furthermore, insulating films 25 are buried respectively in positions between p type semiconductor regions 24. Thereby, a wafer 30 with a super junction structure is obtained (FIG. 8C).

As shown in FIGS. 7A and 7B, the conventional method for obtaining a wafer with a super junction structure requires the step of forming multiple epitaxial layers so as to stack the epitaxial layers in a thickness direction of the semiconductor wafer and the steps of ion implantation and diffusion. Thus, the conventional method has a problem that an extremely large number of processing steps are required.

In addition, the pillar-like semiconductor regions each have a shape in which multiple impurity diffusion regions are stacked. Accordingly, the side surfaces of the pillars (pn junctions) each have an undulate form. Thus, there is a problem that a depletion layer hardly spreads uniformly in a precise sense.

In a case of the method in which one portion of the pillar-like semiconductor layer is formed by oblique ion implantation as shown in FIGS. 8A to 8C, the trenches are each required to have a large width as shown in FIG. 8A, in order to have a uniform impurity profile of, for example, the p type semiconductor layer formed by the ion implantation, in a vertical direction to the wafer. For this reason, it is difficult to arrange multiple super junction structures in the wafer.

SUMMARY OF THE INVENTION

The invention provides a method of processing a semiconductor wafer. The method includes providing a semiconductor wafer of a first general conductivity type, growing a first epitaxial semiconductor layer of the first general conductivity type from the semiconductor wafer, etching the first epitaxial semiconductor layer to form a plurality of trenches, growing a second epitaxial semiconductor layer of a second general conductivity type from the etched first epitaxial semiconductor layer so as to leave a void in each trench, etching the second epitaxial semiconductor layer so as to expose a top surface of the first epitaxial semiconductor layer, growing a third epitaxial semiconductor layer of the first general conductivity type from the exposed top surface of the first epitaxial semiconductor layer and the etched second epitaxial semiconductor layer in the trenches so that the voids are filled at least partially with the third epitaxial semiconductor layer, and etching the third epitaxial semiconductor layer so as to expose the top surface of the first epitaxial semiconductor layer and a top surface of the second epitaxial semiconductor layer.

DESCRIPTION OF THE INVENTION

Embodiments of the present invention will be described below in detail by exemplarily taking a case where a semiconductor substrate is an n type silicon semiconductor substrate by referring to FIGS. 1 to 6E.

First step (FIG. 1): Firstly, an n type silicon semiconductor substrate 1 with a high dopant concentration of approximately $1 \times 10^{20}$ cm$^{-3}$ is prepared. An n type epitaxial layer 2' is formed on the semiconductor substrate 1 as a first epitaxial layer by an epitaxial growth method. The thickness of the n type epitaxial layer 2' in this step is to be the thickness of a super junction of a semiconductor wafer. A dopant concentration of the n type epitaxial layer 2' is, for example, approximately $1 \times 10^{16}$ cm$^{-3}$ and a thickness is, for example, approximately 40 μm.

It is noted that conductivity types such as n+, n and n− belong in one general conductivity type, and conductivity types such as p+, p and p− belong in another general conductivity type.

Figure 1:
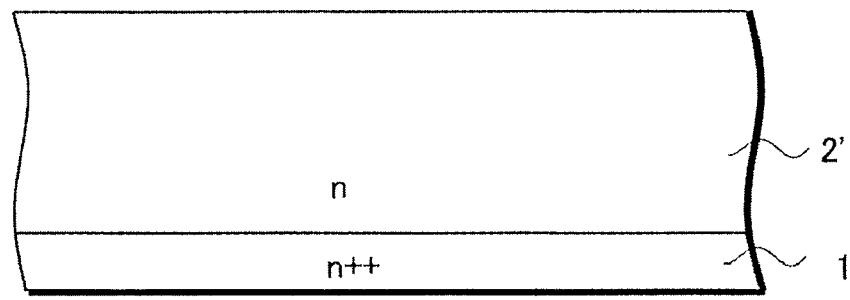
FIG. 1 is a cross-sectional view for illustrating a method for processing a semiconductor wafer in one embodiment of the present invention.
Figure 2A:
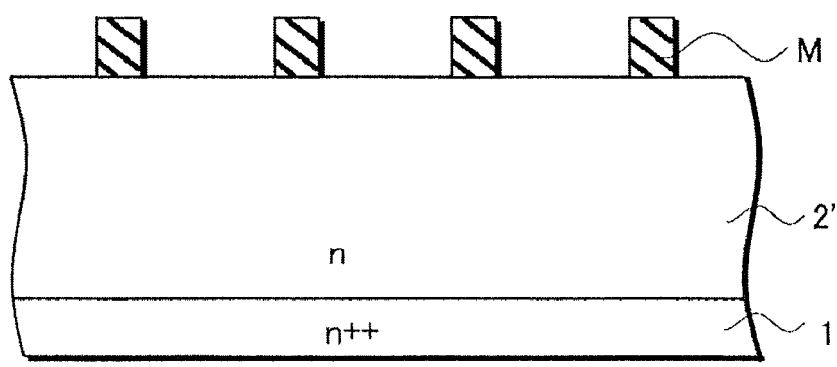
FIGS. 2A and 2B are cross-sectional views for illustrating the method for processing a semiconductor wafer in the embodiment of the present invention.

Second step (FIGS. 2A and 2B): As shown in FIG. 2A, a mask with a desired opening width is provided on the surface of the n type epitaxial layer 2' and the n type epitaxial layer 2' is dry-etched.

Thereby, multiple trenches 3 are formed with enough depth, for example, for the semiconductor substrate 1 to be exposed therethrough. The dry etching may be performed until the semiconductor substrate 1 is exposed or the n type epitaxial layer 2' may remain on bottom portions of the trenches 3. The present embodiment shows the case where the semiconductor substrate 1 is exposed.

Figure 2B:
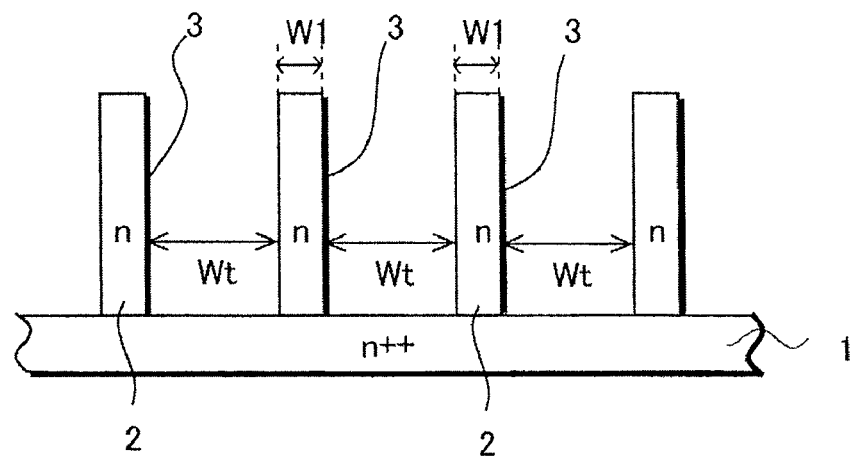
Figure 3:
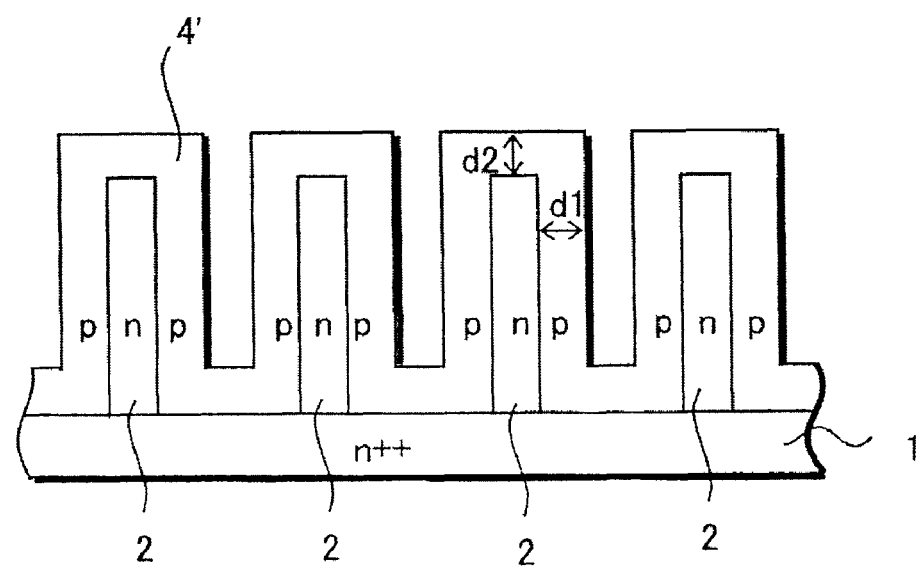
FIG. 3 is a cross-sectional view for illustrating the method for processing a semiconductor wafer in the embodiment of the present invention.
Figure 4:
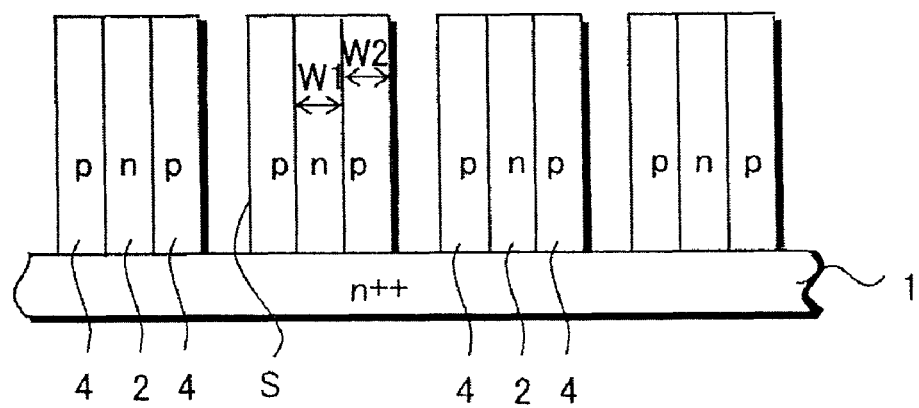
FIG. 4 is a cross-sectional view for illustrating the method for processing a semiconductor wafer in the embodiment of the present invention.
Figure 5:
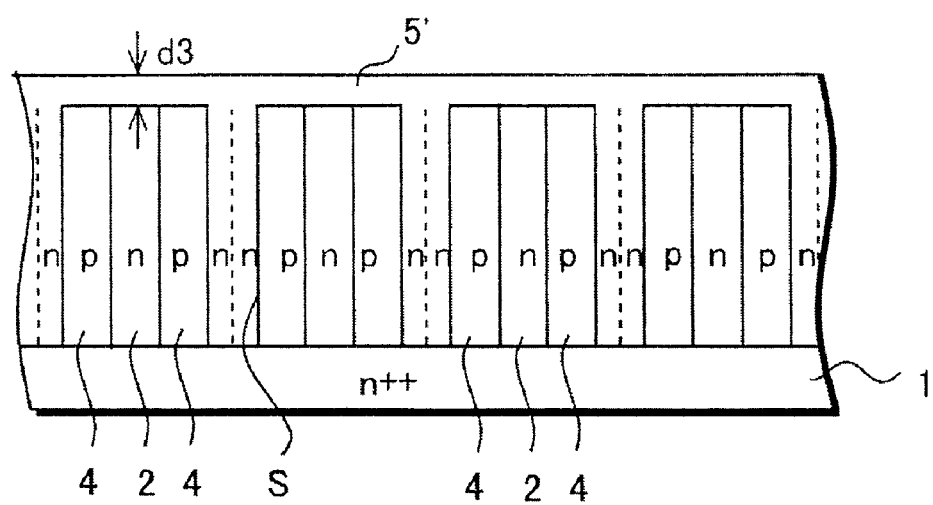
FIG. 5 is a cross-sectional view for illustrating the method for processing a semiconductor wafer in the embodiment of the present invention.

An opening width Wt of each trench 3 is, for example, approximately 30 μm. Thereby, for example, multiple pillar-like n type first semiconductor layers 2 are formed, each layer being spaced apart from one another in the cross-section shown in FIG. 2B. A pattern on the surface of the semiconductor wafer may be a stripe form. The width W1 of the semiconductor layer 2 is, for example, approximately 8 μm (FIG. 2B).

After the trenches 3 are formed, thermal oxidation is performed, for example, at 1100° C. for 10 minutes. Thereafter, a thermally-oxidized film is removed by wet etching to remove a damaged layer damaged due to trench etching.

Third step (FIG. 3): On the semiconductor substrate 1, a second epitaxial layer (p type epitaxial layer) 4' with an opposite conductivity type of the first epitaxial layer 2' (first semiconductor layer 2) is formed by an epitaxial growth method. Note that, if the first epitaxial layer (n type epitaxial layer 2') remains on the bottom portions of the trenches 3 in the second step, the p type epitaxial layer 4' is formed on the remaining n type epitaxial layer 2'. A dopant concentration of the p type epitaxial layer 4' is, for example, approximately $1 \times 10^{16}$ cm$^{-3}$.

The p type epitaxial layer 4' is formed so as to cover sides and upper surfaces of the pillar-like first semiconductor layers 2 and, here, the semiconductor substrate 1 which is exposed between the first semiconductor layers 2. In addition, the p type epitaxial layer 4' has a thickness in the side surface of the first semiconductor layer 2 (a thickness d1 in the horizontal direction of the semiconductor substrate 1) and a thickness d2 in the upper surface of the first semiconductor layer 2 or the surface of the semiconductor substrate 1, and both of the thicknesses d1 and d2 are substantially equal.

Fourth step (FIG. 4): The overall anisotropic etching is performed on the p type epitaxial layer 4' without providing a mask. By performing the etching until the semiconductor substrate 1 between the first semiconductor layers 2 is exposed, the upper surfaces of the first semiconductor layers 2 are exposed because the p type epitaxial layer 4' covering the upper surfaces of the first semiconductor layers 2 is also removed. Note that, if the first epitaxial layer 2' remains in the bottom portions of the trenches 3 in the second step, the etching is performed until the remaining first epitaxial layer 2' is exposed. In this case, the first epitaxial layer 2' remains in the bottom portions of the trenches 3 even in the final structure thereof.

In contrast, the p type epitaxial layer 4' on the side surfaces of the first semiconductor layers 2 remains unremoved. For this reason, the pillar-like p type second semiconductor layers 4 are formed adjacent to both sides of the first semiconductor layers 2. The width W2 of the second semiconductor layer 4 is equivalent to the thickness d1 (=d2) of the p type epitaxial layer 4', which is approximately 8 μm here. Note that the width W1 of the first semiconductor layer 2 and the width W2 of the second semiconductor layer 4 can be appropriately selected based on characteristics thereof. When a width is narrowed, a dopant concentration is increased. Thus, high breakdown voltage and low resistance can be achieved.

Note that, in the present embodiment, a trench-like space S is formed between the second semiconductor layers 4 which are adjacent (opposite) to each other in the present step.

Fifth step (FIG. 5): Furthermore, a third epitaxial layer (n type epitaxial layer) 5' with the same conductivity type as the conductivity type of the first epitaxial layer 2' is formed on the semiconductor substrate 1 by the epitaxial growth method. A dopant concentration of the n type epitaxial layer 5' is, for example, approximately $1 \times 10^{16}$ cm$^{-3}$ and has a thickness d3 of approximately 8 μm.

The n type epitaxial layer 5' is formed so as to cover side and upper surfaces of the pillar-like second semiconductor layers 4 and the upper surface of the first semiconductor layer 2. Then, the n type epitaxial layer 5' is buried in a position between the adjacent second semiconductor layers 4. That is, in this case, the thickness d3 of the n type epitaxial layer 5' is set to be a half of a distance between the adjacent second semiconductor layers 4 (the finally formed trench-like space S (see, FIG. 5)). Thereby, the n type epitaxial layer 5' is buried between the second semiconductor layers 4. In the present embodiment, the case where the third epitaxial layer 5' is buried in the space S is shown (see, FIG. 5). However, the third epitaxial layer 5 is not necessarily (completely) buried in the space S and the thickness d3 is not necessarily set to be a half of the width of the space S. That is, a gap may remain in the space S.

Sixth step (FIG. 6A): The overall anisotropic etching is performed on the n type epitaxial layer 5' without providing a mask. The etching is performed until the upper surfaces of the first semiconductor layers 2 and the second semiconductor layers 4 are exposed. Thereby, pillar-like n type third semiconductor layers 5, which are adjacent to both sides of the second semiconductor layers 4, are formed. A width W3 of the third semiconductor layer 5 is equivalent to the width W1 of the first semiconductor layer 2. That is, a width Wt of the trench 3 is appropriately selected in the second step by considering the width W1 of the first semiconductor layer 2 (third semiconductor layer) and the width W2 of the second semiconductor layer 4. Thereby, all the pillar-like semiconductor layers can be formed of epitaxial layer.

For this reason, a semiconductor wafer 10 with multiple pn junctions (the super junction formed of a p type semiconductor layer and an n type semiconductor layer) in the vertical direction to the upper surface of the semiconductor wafer, that is, a super junction structure can be formed.

In addition, in the present embodiment, the first semiconductor layer 2, the second semiconductor layer 4, and the third semiconductor layer 5 can be formed by the epitaxial growth method, and the thicknesses thereof can be freely controlled. Accordingly, the thicknesses of the first to third epitaxial layers 2', 4', and 5', can be also thinly formed. For this reason, each of the first semiconductor layer 2, the second semiconductor layer 4, and the third semiconductor layer 5 can be set to have an aspect ratio of a long side to a short side of, for example, 10 to 1 in a cross-section shown in FIG. 6A, that is, in the cross-section in which the multiple pn junctions of the semiconductor wafer 10 are exposed. This means that the first semiconductor layer 2, the second semiconductor layer 4, and the third semiconductor layer 5 respectively have widths W1, W2, and W3 (short sides), which are extremely thin in relation to lengths (long sides) in the thickness direction of the semiconductor wafer 10.

If the widths W1, W2, and W3 of the respective semiconductor layers are narrow, critical field strengths thereof become higher in order to increase the dopant concentrations. Thus, high breakdown voltage and low resistance can be achieved.

Moreover, the first to third semiconductor layers 2, 4, and 5 are all epitaxial layers. Thereby, the dopant concentration profiles in the depth direction of the semiconductor wafer 10 become uniform. Thus, the depletion layer can spread uniformly, when compared with the case where these layers have a super junction structure formed by ion implantation.

Figure 7A:
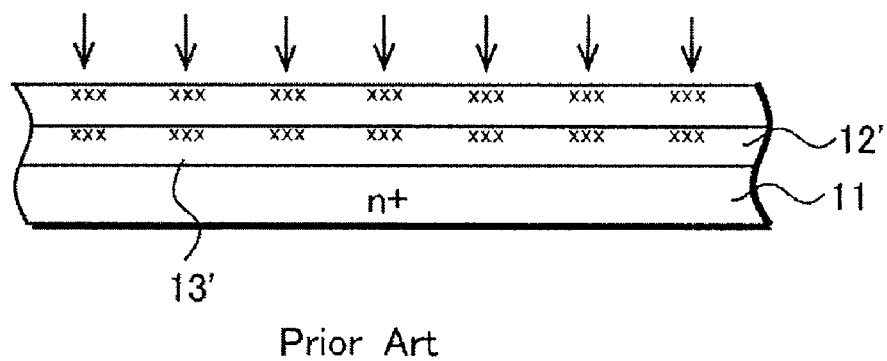
FIGS. 7A and 7B are cross-sectional views for illustrating the method for processing a semiconductor wafer in the conventional type.
Figure 7B:
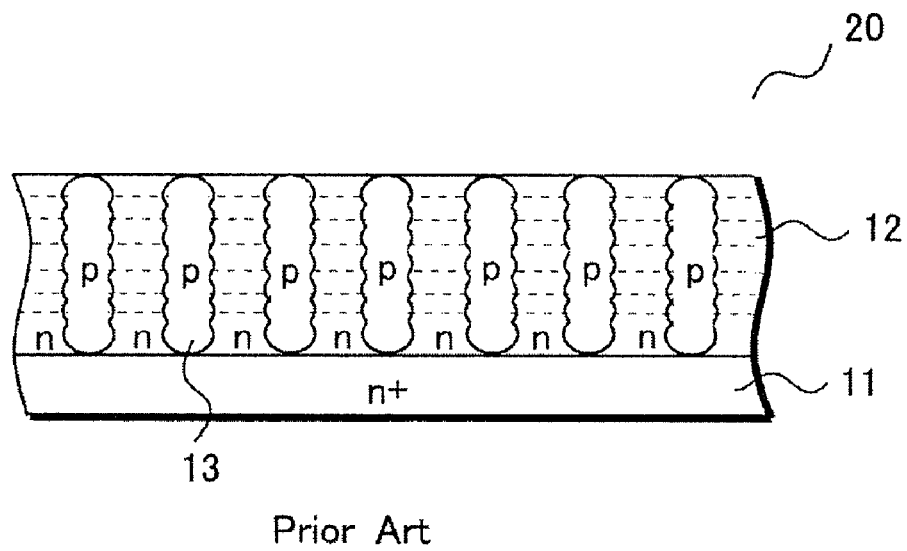
Figure 8A:
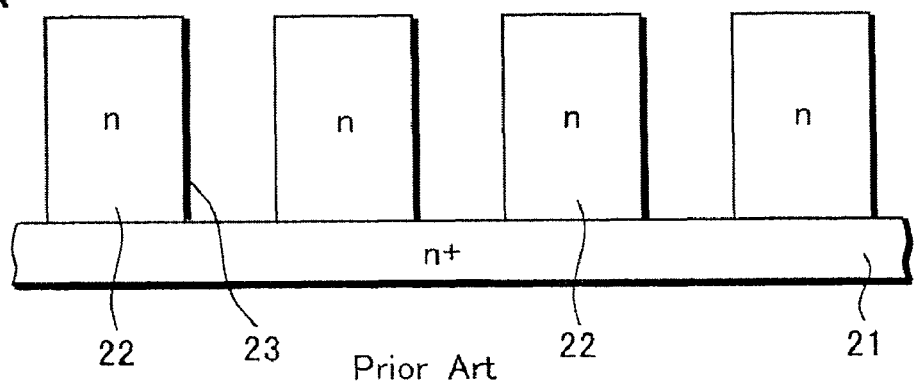
FIGS. 8A to 8C are cross-sectional views for illustrating the method for processing a semiconductor wafer in the conventional type.
Figure 8B:
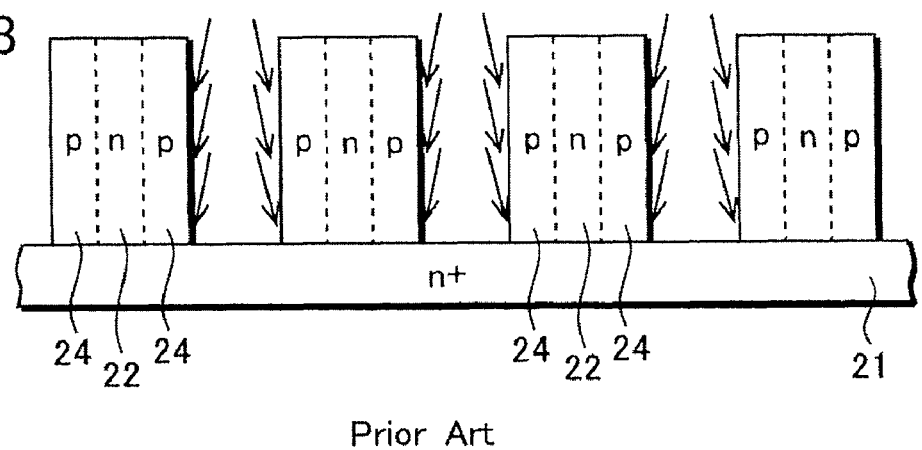
Figure 8C:
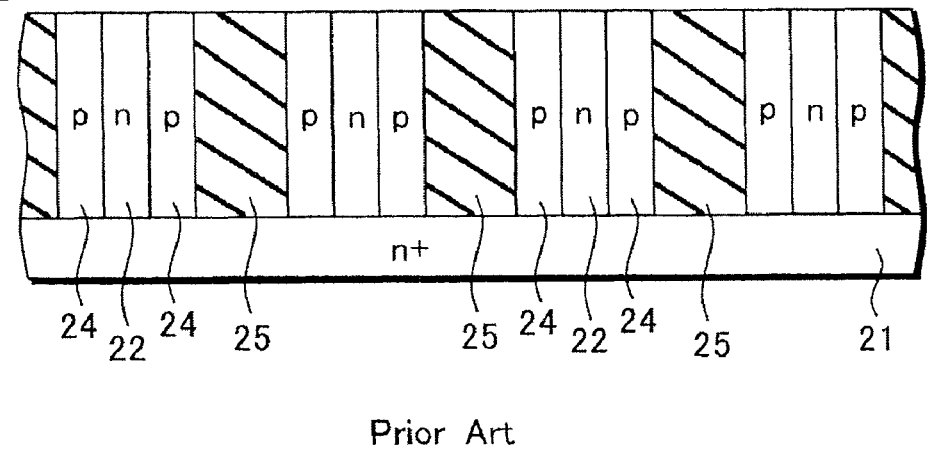

Furthermore, the first to third semiconductor layers 2, 4, and 5 are all epitaxial layers. Thereby, the pn junction surfaces can be formed so as to be vertical to the surface of the semiconductor wafer 10. As shown in FIGS. 7A and 7B, in a case of the super junction structure formed by repeatedly performing formation of a multi-layered epitaxial layer and ion implantation in the thickness direction of the semiconductor wafer, the pn junction surface actually becomes undulate. Thus, there is a problem that the depletion layer hardly spread uniformly in the precise sense. However, in the present embodiment, the pn junction surface is a surface which is vertical to the semiconductor wafer surface, which allows the depletion layer to spread uniformly.

Figure 6A:
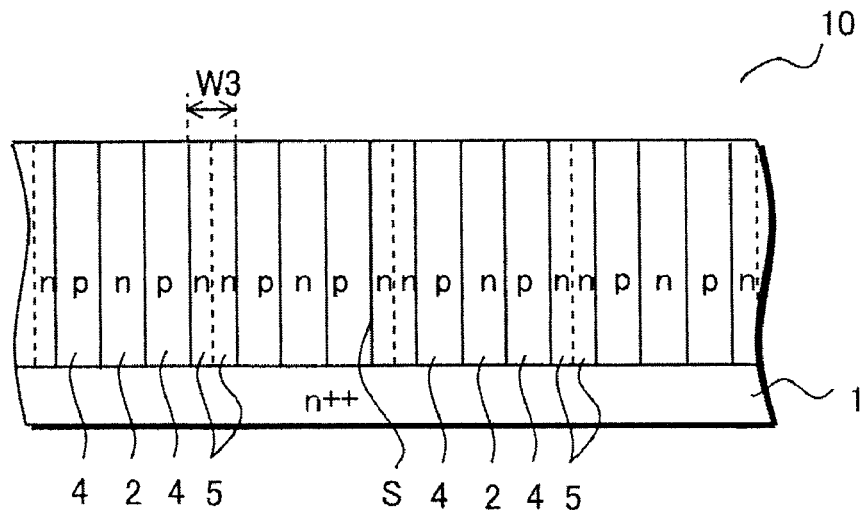
FIG. 6A to 6E are cross-sectional views for illustrating the method for processing a semiconductor wafer in the embodiment of the present invention.
Figure 6B:
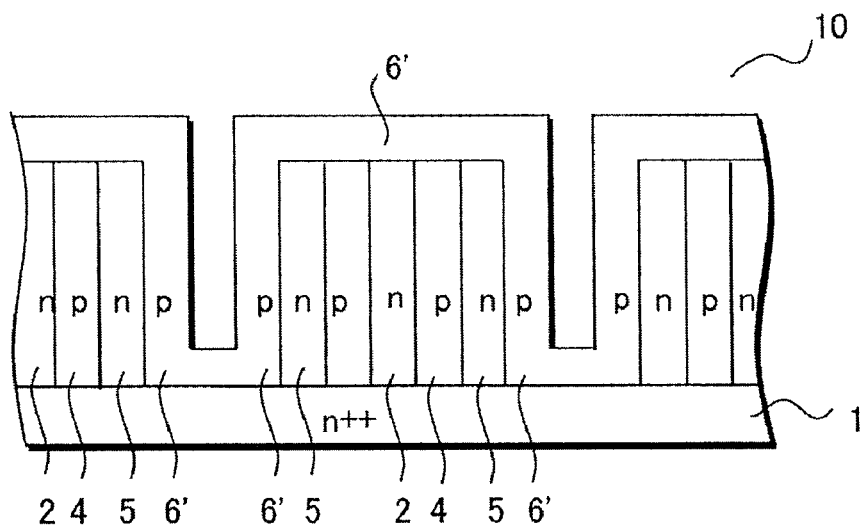

In FIG. 6A, the case where the semiconductor wafer 10 is completed by causing the third semiconductor layer 5 to be buried in a position between the second semiconductor layers 4 is described. However, if the opening width Wt of the trench 3 is wider, a pillar-like semiconductor layer may be further repeatedly formed.

In other words, by repeating the above-described third to sixth steps, a step of forming another epitaxial layer (for example, a p type epitaxial layer) and a step of etching the epitaxial layer are repeated to form other pillar-like semiconductor layers, which are alternately formed to be adjacent each other.

Figure 6C:
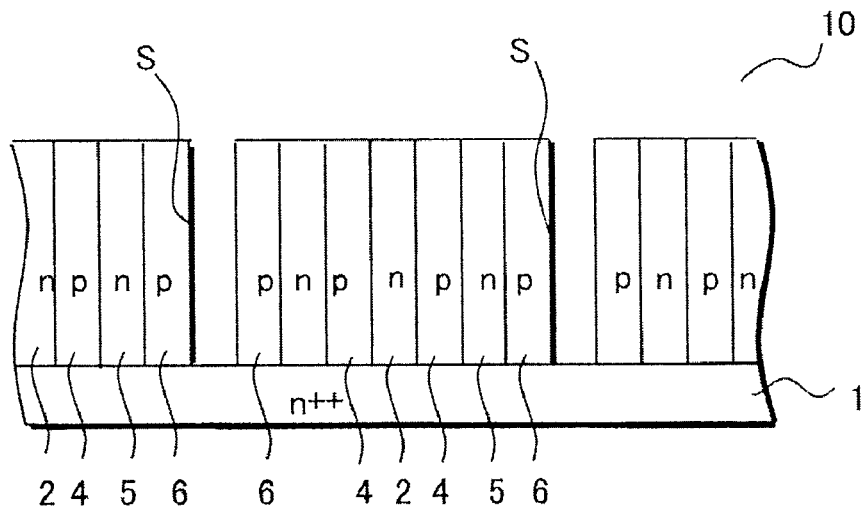
Figure 6D:
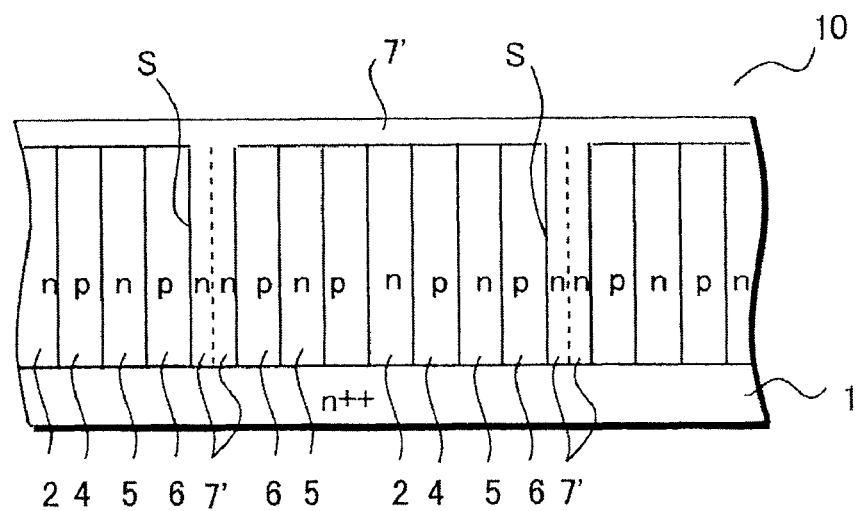
Figure 6E:
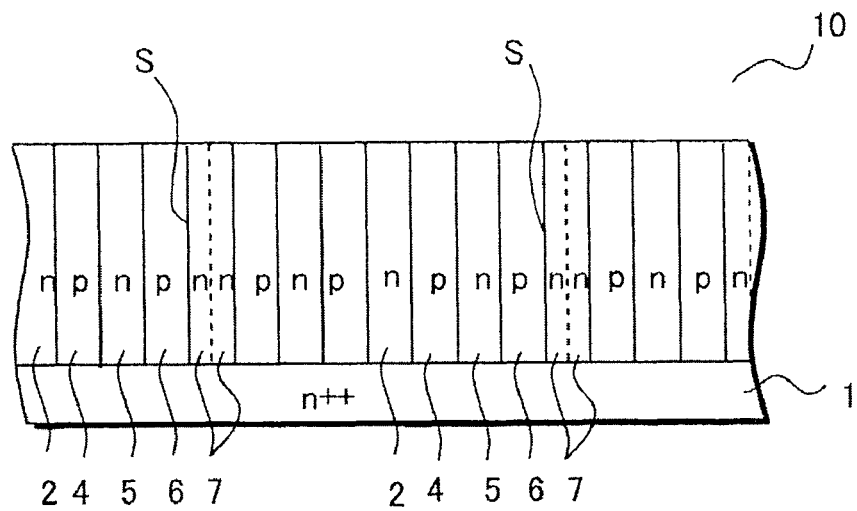

Specifically, a p type epitaxial layer 6' is formed after the third semiconductor layer 5 is formed (FIG. 6B), and then the p type epitaxial layer is etched. Thereby, another pillar-like p type semiconductor layer 6 is formed (FIG. 6C). Furthermore, an n type epitaxial layer 7' may be formed and then etched to form another pillar-like n type semiconductor layer 7 (FIGS. 6D and 6E). Also, a p type semiconductor layer and an n type semiconductor layer may be further alternately formed.

Note that, if the first epitaxial layer 2' remains on the bottom portions of the trenches 3 in the second step, the etching is performed until the remaining first epitaxial layer 2' in the bottom portions of the trenches 3 is exposed when a pillar-like p type semiconductor layer or a pillar-like n type semiconductor layer is formed in the subsequent steps.

As described above, in the method for processing a semiconductor wafer according to the present embodiment, the formation and etching of an n type epitaxial layer and the formation and etching of a p type epitaxial layer are alternately repeated for at least three times. Then, all the pillar-like semiconductor layers are formed of epitaxial layers.

Since all the pillar-like semiconductor layers are formed of epitaxial layers, the widths of the respective layers can be formed as desired. That is, the widths of the respective semiconductor layers can be narrowed. Thereby, the dopant concentrations thereof can be increased. Thus, high breakdown voltage and low resistance can be achieved.

In addition, the dopant concentration profiles of the respective semiconductor layers become uniform and thus the pn junction surface is formed so as to be vertical to the surface of the semiconductor wafer 10. Thereby, the depletion layer can spread uniformly. Thus, the method for processing a semiconductor wafer, with which the characteristics of the super junction structure can be efficiently utilized, can be provided.

As described above, in the present embodiment, the case where an n type silicon semiconductor substrate is used as the semiconductor substrate 1 has been described as an example. However, a p type silicon semiconductor substrate may be used. In addition, the case where an n type semiconductor layer (epitaxial layer) is formed in the first step has been described as an example. However, a p type semiconductor layer may be similarly formed.

According to the embodiment of the present invention, the following effects can be obtained.

Firstly, all of the p type semiconductor layers and n type semiconductor layers forming super junctions are formed by epitaxial growth. Thus, the structure can be obtained in which the p type semiconductor layers and the n type semiconductor layers having a uniform impurity concentration profile in the direction vertical to the surface of the semiconductor wafer are alternately arranged. Thereby, the method for processing a semiconductor wafer having super junctions each with a uniformly-spread depletion layer can be provided.

Secondly, the semiconductor layers forming the super junctions are all epitaxial layers. Thus, the pn junctions can be formed vertically to the surface of the semiconductor wafer. In the super junction structure which is formed by repeating formation of an epitaxial layer and ion implantation so as to form multiple epitaxial layers in the thickness direction of the semiconductor wafer, the pn junction surfaces result in being undulate in actual. Thus, there is a problem that the depletion layer hardly spreads uniformly in a precise sense. However, in the present embodiment, the pn junction surfaces are each formed vertically to the upper surface of the semiconductor wafer, which also allows the depletion layers to spread uniformly.

Thirdly, all the semiconductor layers forming the super junctions are formed by epitaxial growth. Thus, the semiconductor layers can each be formed so as to have a desired value as the width (the lengths of the short side) in the cross section of the semiconductor wafer including the multiple pn junctions.

In other words, the widths of the semiconductor layers can be reduced compared to those of the conventional semiconductor layers. By reducing the widths of the semiconductor layers, the pinch-off width of the depletion layer spreading in each of the semiconductor layers also decreases. Meanwhile, if the same breakdown voltage is maintained, the impurity concentrations of the semiconductor layers can each be increased by reducing the width of the semiconductor layer. Accordingly, the resistance of the semiconductor wafer to be a current path when a forward voltage is applied can be further reduced.

Fourthly, the number of steps for processing a semiconductor wafer can be reduced according to the present invention, compared with the conventional method in which multiple pn junctions are formed in a thickness direction of a semiconductor wafer by performing epitaxial growth and ion implantation.

What is claimed is:

1. A method of processing a semiconductor wafer, comprising:
    providing a semiconductor wafer of a first general conductivity type;
    growing a first epitaxial semiconductor layer of the first general conductivity type only from the semiconductor wafer;
    etching the first epitaxial semiconductor layer to form a plurality of trenches;
    growing a second epitaxial semiconductor layer of a second general conductivity type from the etched first epitaxial semiconductor layer so as to leave a void in each trench;
    etching the second epitaxial semiconductor layer so as to expose a top surface of the first epitaxial semiconductor layer;
    growing a third epitaxial semiconductor layer of the first general conductivity type from the exposed top surface of the first epitaxial semiconductor layer and the etched second epitaxial semiconductor layer in the trenches so that the voids are filled at least partially with the third epitaxial semiconductor layer; and
    etching the third epitaxial semiconductor layer so as to expose the top surface of the first epitaxial semiconductor layer and a top surface of the second epitaxial semiconductor layer,
    wherein the first epitaxial semiconductor layer has substantially the same impurity concentration as the third epitaxial semiconductor layer.

2. The method of claim 1, wherein a portion of the first epitaxial semiconductor layer damaged during the formation of the trenches is removed by thermal oxidation.

3. A method of processing a semiconductor wafer, comprising:
    providing a semiconductor wafer of a first general conductivity type;
    growing a first epitaxial semiconductor layer of the first general conductivity type from the semiconductor wafer;
    etching the first epitaxial semiconductor layer to form a plurality of trenches;
    growing a second epitaxial semiconductor layer of a second general conductivity type from the etched first epitaxial semiconductor layer so as to leave a void in each trench;
    etching the second epitaxial semiconductor layer so as to expose a top surface of the first epitaxial semiconductor layer;
    growing a third epitaxial semiconductor layer of the first general conductivity type from the exposed top surface of the first epitaxial semiconductor layer and the etched second epitaxial semiconductor layer in the trenches so that the voids are not filled fully with the third epitaxial semiconductor layer;
    etching the third epitaxial semiconductor layer so as to expose the top surface of the first epitaxial semiconductor layer and a top surface of the second epitaxial semiconductor layer;
    growing a fourth epitaxial semiconductor layer of the second general conductivity type from the exposed top surfaces of the first and second epitaxial semiconductor layers and the etched third epitaxial semiconductor layer in the voids; and
    etching the fourth epitaxial semiconductor layer so as to expose the top surfaces of the first and second epitaxial semiconductor layers and a top surface of the third epitaxial semiconductor layer.

4. The method of claim 3, wherein impurity concentration profiles of the first to fourth epitaxial semiconductor layers are uniform in a direction vertical to the semiconductor wafer surface.

5. The method of claim 1, wherein the first epitaxial semiconductor layer is grown from the semiconductor wafer so as to be substantially flat.

* * * * *